US008473826B1

(12) United States Patent
Caldwell

(10) Patent No.: US 8,473,826 B1
(45) Date of Patent: Jun. 25, 2013

(54) HYBRID SOFT DECISION HARD DECISION REED SOLOMON DECODING

(75) Inventor: James Caldwell, Chantilly, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 242 days.

(21) Appl. No.: 12/852,136

(22) Filed: Aug. 6, 2010

Related U.S. Application Data

(60) Provisional application No. 61/233,452, filed on Aug. 12, 2009.

(51) Int. Cl.
*H03M 13/00* (2006.01)

(52) U.S. Cl.
USPC .......................................................... 714/784

(58) Field of Classification Search
USPC ................ 714/752, 755, 780, 781, 784–786
See application file for complete search history.

(56) References Cited

U.S. PATENT DOCUMENTS

| | | | |
|---|---|---|---|
| 5,606,569 A * | 2/1997 | MacDonald et al. ......... | 714/758 |
| 6,721,373 B1 * | 4/2004 | Frenkel et al. ................ | 375/346 |
| 7,093,188 B2 * | 8/2006 | Maiuzzo et al. .............. | 714/795 |
| 7,328,395 B1 * | 2/2008 | Burd ............................. | 714/780 |
| 7,353,449 B2 | 4/2008 | Muller et al. | |
| 2004/0030984 A1 * | 2/2004 | Renaud ......................... | 714/784 |
| 2006/0248435 A1 * | 11/2006 | Haratsch ....................... | 714/784 |
| 2010/0174969 A1 * | 7/2010 | Ashe et al. .................... | 714/781 |

OTHER PUBLICATIONS

Caldwell, J.; Robertson, C. "M-ary hyper phase-shift keying with Reed Solomon encoding and soft decision reliability information," Military Communications Conference, 2009. MILCOM 2009. IEEE, pp. 1-7, Oct. 18-21, 2009. [retrieved on Aug. 10, 2010]. Retrieved from the Internet: <URL: URL: http://ieeexplore.ieee.org/stamp/stamp.jsp?tp=&arnumber=5380034&isnumber=5379707>.
Caldwell, J.; Tummala, M. "Hyper Phase Shift Keying (HPSK) Modulation," Signals, Systems and Computers, 2007, ACSSC 2007. Conference Record of the Forty-First Asilomar Conference on, pp. 1000-1004, Nov. 4-7, 2007. [retrieved on Aug. 10, 2010]. Retrieved from the Internet: <URL: http://ieeexplore.ieee.org/stamp/stamp.jsp?tp=&arnumber=4487371&isnumber=4487143>.
Augot, D. and A. Zeh. "On the Roth and Ruckenstein Equations for Guruswami-Sudan Algorithm". Proceedings IEEE ISIT Conference, 2008, pp. 2620-2624.
Caldwell, J. and C. Robertson. "Long Block Length Reed Solomon Coded M-ary Hyper Phase Shift Keying", Proc. Asilomar Conference on Signals, Systems, and Computers, Oct. 2008, pp. 1-5.

(Continued)

Primary Examiner — Scott Baderman
Assistant Examiner — Joseph Kudirka
(74) Attorney, Agent, or Firm — Lisa A. Norris

(57) ABSTRACT

Embodiments in accordance with the invention utilize Reed Solomon (RS) forward error correction (FEC) coding in conjunction with M-ary Bandwidth Efficient Modulation (BEM) schemes and soft decision decoding to improve the robustness of high spectral efficiency communications links. In one embodiment, information symbols in communication data blocks are encoded utilizing Reed Solomon (RS) forward error correction (FEC) coding and transmitted with either M-ary phase shift keying (MPSK) or M-ary quadrature amplitude modulation (MQAM). Using standard Reed Solomon (RS) hard decision decoding, a receiver either correctly decodes the received block or returns a decoding failure. In the event of a decoding failure, soft decision reliability information is used to identify received code symbols with a low probability of being correctly received and to generate new code symbol estimates that are used in the traditional Reed Solomon decoding algorithm.

4 Claims, 6 Drawing Sheets

OTHER PUBLICATIONS

Caldwell, J. and C. Robertson. "Reed Solomon Coded M-ary Hyper Phase Shift Keying", Proc. Milcom Conference, Nov. 2008, pp. 1-5.

Gallager, R.G. "Low-Density Parity-Check Codes". IRE Transactions on Information Theory. vol. IT—Jan. 1962, pp. 21-28.

Guruswami, V. and M. Sudan. "Improved Decoding of Reed-Solomon Codes and Algebraic Geometry Codes". IEEE Transactions on Information Theory. vol. 45, Sep. 1999, pp. 1757-1767.

Koetter, R. and A. Vardy. "Algebraic Soft-Decision Decoding of Reed-Solomon Codes". IEEE Transactions on Information Theory. vol. 94, Nov. 2003, pp. 2809-2825.

McEliece, R. "The Guruswami-Sudan Decoding Algorithm for Reed-Solomon Codes". JPL Interplanetary Network Progress Report 42-153, 2003.

Roth, R. and G. Ruckenstein. "Efficient Decoding of Reed-Solomon Codes Beyond Half the Minimum Distance". IEEE Transactions on Information Theory, vol. 46, Jan. 2000, pp. 246-257.

Wu, X. and P. Siegel. "Efficient Root-finding Algorithm with Application to List Decoding of Algebraic-Geometric Codes". IEEE Transactions Information Theory, vol. 47, Sep. 2001, pp. 2579-2587.

* cited by examiner

HYBRID SOFT DECISION HARD DECISION REED SOLOMON DECODING

CROSS-REFERENCE TO RELATED APPLICATIONS

This application claims the benefit of U.S. Provisional Application No. 61/233,452, filed Aug. 12, 2009, which is hereby incorporated in its entirety by reference.

BACKGROUND OF THE INVENTION

1. Field of the Invention

The present invention relates generally to communications systems. More particularly, the invention relates to decoding of encoded data in a communications system.

2. Description of the Related Art

Currently many conventional communications systems use forward error correction (FEC) coding to improve bit error rates at low received energy levels. Ideally, in communications links, received signal strength is often comparable to that of noise. Additionally, due to bandwidth concerns, bandwidth efficient modulation (BEM) schemes with high spectral efficiency are currently used in the new standards such as ATSC and DVB-H. These standards use high code rate Reed Solomon (RS) codes.

High spectral efficiency links commonly use either a rate 0.875 or 0.9 RS code with a block length of 255 symbols. Long block length FEC codes such as RS codes can be used for data and video transfers. Additionally, long block length FEC codes are used in scenarios where the error floor obtained using turbo codes is undesirable. Previous researchers have developed soft decision (SD) RS decoding algorithms, often referred to as Guruswami-Sudan (GS) SD decoding or GS SD RS decoding. However, the GS SD RS decoding algorithm is computationally complex because the algorithm requires estimating polynomials in the Galois field and then factoring these polynomials to estimate a list of possible valid codewords. The computational complexity of the GS SD RS decoding algorithm is proportional to $n^2 m^4$ where n is the block length of the RS code and m is the required multiplicity of the polynomial.

SUMMARY OF THE INVENTION

Embodiments in accordance with the invention provide a hybrid soft decision (SD) hard decision (HD) Reed Solomon (RS) decoding system and method with improved bit error performance without the significant increase in computational complexity of Guruswami-Sudan (GS) SD decoding.

In accordance with one embodiment, a hybrid soft decision (SD) hard decision (HD) Reed Solomon (RS) decoding method includes: (a) inputting received code symbols into a hard decision (HD) Reed Solomon (RS) decoding method; (b) decoding the received code symbols with the HD RS decoding method; (c) determining whether a decoding failure occurs; (d) wherein when a decoding failure does not occur, outputting the decoded data; (e) wherein when a decoding failure occurs, computing soft decision (SD) reliability information for each code symbol; (f) selecting the most likely code symbol errors for each code symbol; (g) inputting the most likely code symbol errors for each code symbol into the HD RS decoding method to generate a revised HD RS decoding method; (h) decoding the received code symbols with the revised HD RS decoding method; (i) determining whether a decoding failure occurs; (j) wherein when a decoding failure does not occur, outputting the decoded data; (k) wherein when a decoding failure occurs, selecting the next most likely code symbol errors for each code symbol; (l) inputting the next most likely code symbol errors for each code symbol into the HD RS decoding method to generate a revised HD RS decoding method; and (m) returning to operation (h).

In some embodiments, when a decoding failure occurs, the method further includes: determining whether a decoding failure threshold is met; wherein when the decoding failure threshold is met, generating a decoding failure and exiting the method; and wherein when the decoding failure threshold is not met, continuing the method.

Embodiments in accordance with the invention are best understood by reference to the following detailed description when read in conjunction with the accompanying drawings.

Embodiments in accordance with the invention are further described herein with reference to the drawings.

DETAILED DESCRIPTION OF THE INVENTION

Generally viewed, embodiments in accordance with the hybrid SD HD RS decoding method detailed herein initially utilize a traditional hard decision (HD) Reed Solomon (RS) decoding method, e.g., an HD RS decoder, however, when a decoding failure occurs, SD reliability information is then used to estimate which received code symbols have a low probability of being correctly received. This information is used to generate new code symbol estimates which are subsequently used, e.g. incorporated, in the HD RS decoding algorithm and used to decode the code symbols.

Because the majority of decoding failures are caused when the total number of code symbol errors exceeds the error correction capability, t, of the HD RS code by only a few symbols, only a few code symbols must be corrected in this fashion in order to successfully decode the received block. Because block errors occur infrequently, the great majority of the time only the HD RS decoding algorithm is utilized. The complexity of hard decision decoding is proportional to $n\log_2 n$. This reduction in computational complexity is significant as compared to the GS SD algorithm.

Embodiments in accordance with the hybrid SD HD RS decoding method described herein offer improved bit error performance without the significant increase in computational complexity of GS SD RS decoding.

Figure 1:
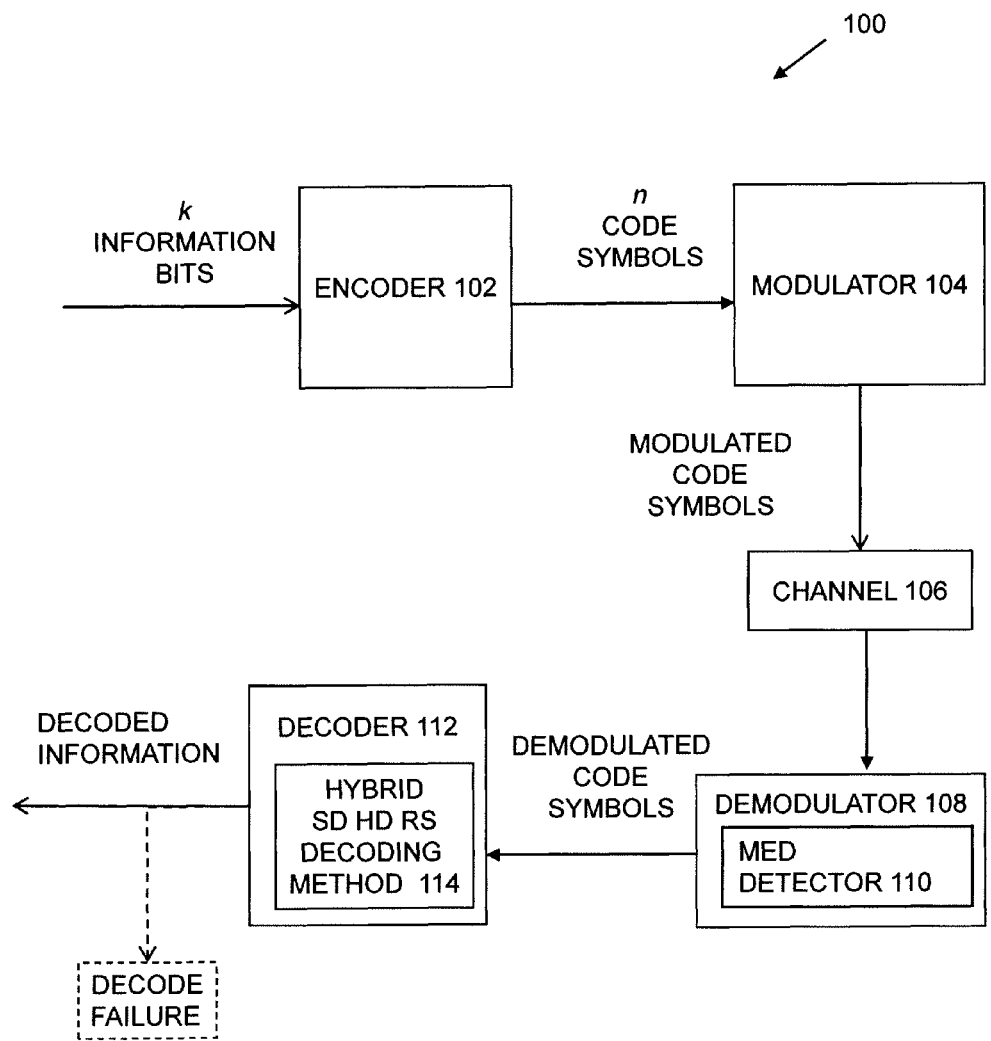
FIG. 1 is a schematic block diagram illustrating a communication system including a hybrid SD HD RS decoding method in accordance with one embodiment.

FIG. 1 is a schematic block diagram illustrating a communication system 100 including a hybrid SD HD RS decoding method in accordance with one embodiment. In one embodiment, communication system 100 utilizes Reed Solomon (RS) forward error correction (FEC) coding and Bandwidth Efficient Modulation (BEM) modulations. In FIG. 1, an encoder 102 takes k information data bits and produces n code symbols which are modulated in a modulator 104 and transmitted over a channel 106 using either single- or double-symbol transmission, where double-symbol transmission requires two BEM modulation symbols to transmit each RS code symbol. The use of double-symbol transmission results in an increase in block length to lengths comparable to the block lengths used in current industry-standard low density parity check (LDPC) codes.

With BEM, the addition of more code symbols in the constellation space does not increase the bandwidth required. Therefore, BEM modulation schemes are considered spectrally efficient. In one embodiment, the BEM modulation scheme is M-ary phase shift keying (MPSK) or M-ary quadrature amplitude modulation (MQAM). With M=ary hyper phase-shift keying (MHPSK) the symbols are assigned to various equally spaced phases around a circle in the two-dimensional signal space; however, with M-ary quadrature amplitude modulation (MQAM) the symbols are assigned to various energy levels and phases in the two-dimensional signal space.

A demodulator 108 receives the modulated code symbols, i.e. the received code symbols, transmitted over channel 106. A minimum-Euclidean distance (MED) detector 110 in demodulator 108 estimates the received code symbols based on the principle that the received signal is demodulated as the signal that is closest to one of the M-ary allowable signals. Thus, MED detector 110 estimates the received code symbol as the symbol that is closest in the four-dimensional Euclidean space to one of the M-ary allowable symbols. This detection method is a form of maximum-likelihood detection that minimizes the probability of received code symbol error. The detection method then repeats itself for the next symbol in the data stream and so on. For double-symbol transmission, the double-symbol estimates are converted to a single RS symbol that is input into a decoder 112 including the hybrid SD HD RS decoding method 114.

Decoder 112 decodes the code symbols and produces the estimated information bits utilizing hybrid SD HD RS decoding method 114. In accordance with one embodiment, in the event of a decoding failure, SD reliability information is used to estimate the received code symbols with the lowest chance of having been correctly received.

With RS forward error correction (FEC) coding, the probability of coded symbol error over the channel determines the probability of information bit error. The probability of coded symbol error for hard decision decoding over the channel can be found using tight union bounds that are extremely accurate for probability of information bit errors smaller than $10^{-3}$. Thus, the results obtained with hybrid SD HD RS decoding method 114 are superior to those obtained with conventional HD decoding as further described herein.

As earlier described, in one embodiment, only in the event of a decoding failure is soft decision reliability information calculated. The SD reliability information is computed as a matrix for all possible symbols at each code symbol location where each matrix element is given by $$P_r(T = t_\alpha \mid R = r_\beta) = \frac{f(r_\beta \mid t_\alpha)}{\sum_{t \in T} f(r_\beta \mid t)} \quad (1)$$

where T is the M-ary signal that represents a transmitted symbol, R is a random variable that models the received signal, $f(r_\beta|t_\alpha)$ is a conditional probability density function, α varies from 1 to M (the number of symbols in the constellation), and β varies from 1 to n, the block length of the code.

Figure 2A:
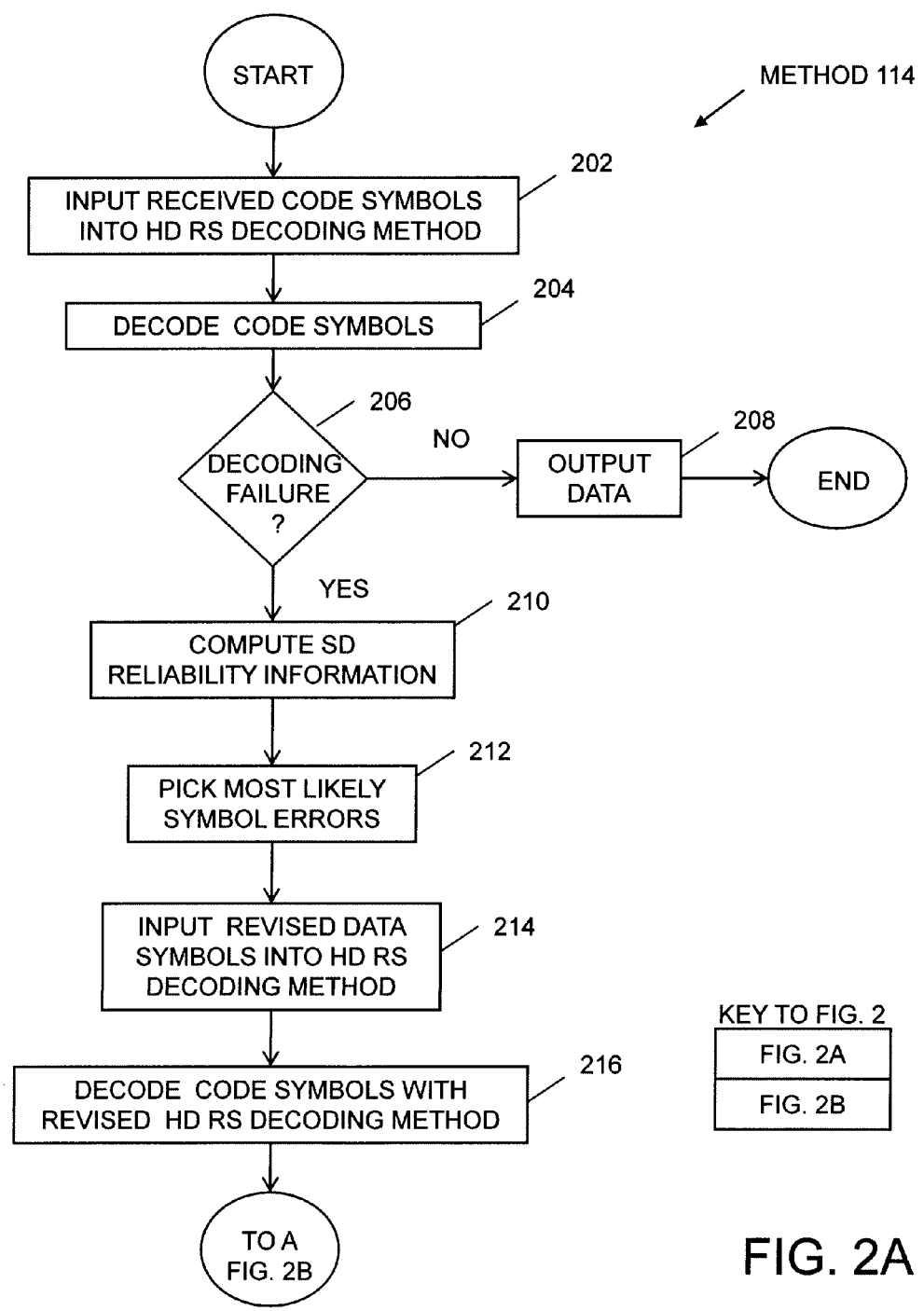
FIG. 2, illustrated in FIGS. 2A and 2B, is a flow diagram is a hybrid SD HD RS decoding method in accordance with one embodiment.
Figure 2B:
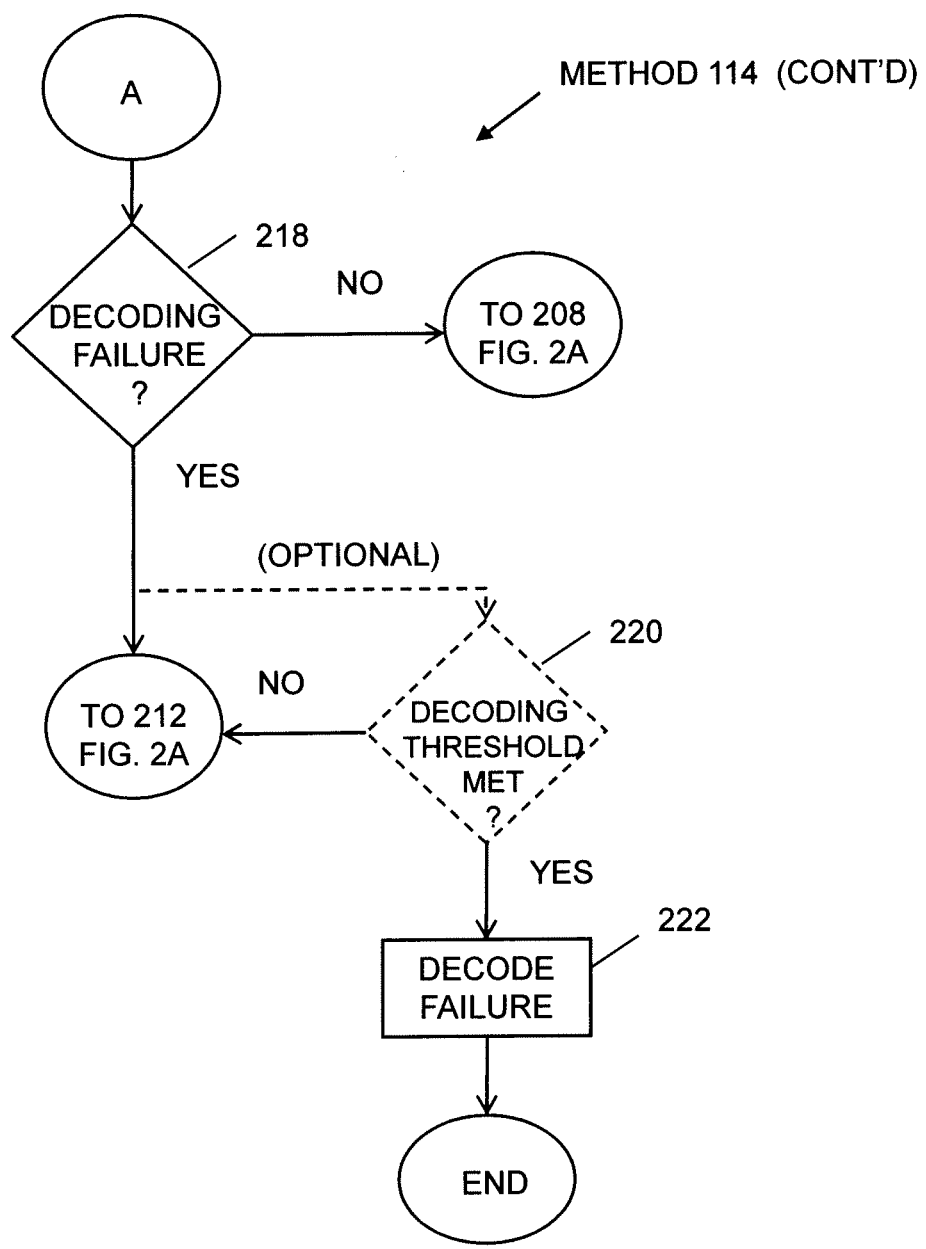

FIG. 2, illustrated in FIGS. 2A and 2B, is a flow diagram of a hybrid SD HD RS decoding method 114 in accordance with one embodiment. Referring initially to FIG. 2A, in operation 202 received demodulated code symbols are input into decoder 112 including hybrid SD HD RS decoding method 114. More particularly, initially, in one embodiment, the demodulated code symbols are input into a hard decision Reed Solomon (HD RS) decoding method for decoding. HD RS decoding methods, e.g., HD RS decoding algorithms, are well known to those of skill in the art and are not further detailed herein. From operation 202 processing transitions to operation 204.

In operation 204 the HD RS decoding method is used to decode the received data symbols. The HD RS decoding can be either successful or unsuccessful. For example, if there are nine most likely possible symbol errors, then there are 256 possible error iterations for the algorithm. However, most of the time the HD RS decoding method successfully decodes the received code symbols with one iteration. From operation 204 processing transitions to a check operation 206.

In check operation 206 a determination is made whether the HD RS decoding method failed. If the HD RS decoding method did not fail ("NO"), processing transitions from check operation 206 to operation 208. In operation 208 the decoded data, also termed herein decoded information, is output and hybrid SD HD RS decoding method 114 exited.

Alternatively, if the HD RS decoding method failed ("YES"), processing transitions from check operation 206 to an operation 210. In operation 210 soft decision (SD) reliability information is computed to determine the most likely code symbol errors. As earlier described, in one embodiment, the SD reliability information is computed as a matrix for all possible symbols at each code symbol location where each matrix element is given by $$P_r(T = t_\alpha \mid R = r_\beta) = \frac{f(r_\beta \mid t_\alpha)}{\sum_{t \in T} f(r_\beta \mid t)}$$

where T is the M-ary signal that represents a transmitted symbol, R is a random variable that models the received signal, $f(r_\beta|t_\alpha)$ is a conditional probability density function, α varies from 1 to M (the number of symbols in the constellation), and β varies from 1 to n, the block length of the code. From operation 210 processing transitions to an operation 212.

In operation 212 the most likely data symbols are selected for each code symbol using the SD reliability information computed in operation 210. From operation 212 processing transitions to operation 214.

In operation 214 the most likely data symbols selected in operation 212 are input into the HD RS decoding method to generate a revised HD RS decoding method, e.g., a revised HD RS decoding algorithm. From operation 214 processing transitions to an operation 216.

In operation 216 decoding of the code symbols is reattempted using the revised HD RS method. From operation 216 processing transitions to a check operation 218 (FIG. 2B).

Referring now to FIG. 2B, in check operation 218, a determination is made whether the decoding of operation 216 failed. If decoding did not fail ("NO"), processing transitions to operation 208 (FIG. 2A), and the successfully decoded data is output with processing exiting hybrid SD HD RS decoding method 114. Alternatively, if decoding failed ("YES"), from check operation 218 processing transitions to operation 212 with the next most likely code symbol errors being selected. Thus, each additional iteration goes through the list of most likely code symbol errors varying between the hard decision and next most likely symbol estimates one by one.

Referring back again to FIG. 2B, optionally, in some embodiments, if the HD RS decoding method failed ("YES"), prior to automatically returning to operation 212, processing transitions to an optional check operation 220. In optional check operation 220 a determination is made whether a threshold number of decoding failures, also termed herein the decoding failure threshold, has occurred. In some embodiments, the decoding failure threshold is a default value, while in others the decoding failure threshold can be user selectable. In one embodiment, if the decoding failure threshold is met ("YES"), i.e., method 114 has failed to successfully decode the received code symbols in a selected number of times using one or more revised HD RS decoding method iterations, and processing transitions from check operation 220 to an operation 222. In operation 222 a decode failure is indicated and processing exits hybrid SD HD RS decoding method 114. This prevents method 114 from continually re-attempting to decode the code symbols.

Alternatively, if the decoding failure threshold is not met ("NO"), processing transitions from check operation 220 to operation 212 (FIG. 2A) with the next most likely symbol errors being selected and the process repeating as earlier described.

In one embodiment, the probability that t or fewer symbol errors are received is $$P_t \approx 1 - \frac{1}{n}\sum_{i=t+1}^{n} i\binom{n}{i}p_s^i(1-p_s)^{n-i} \quad (2)$$

where for a (63, 43) code t=8, n=63, k=47, and the probability of channel symbol error $p_s$ is taken for double symbol transmission with 8-PSK (see for example, "Long Block Length Reed Solomon Coded M-ary Hyper Phase Shift Keying", *Proc. Asilomar Conf. on Signals, Systems, and Computers, October* 2008 by J. Caldwell and C. Robertson, herein incorporated in its entirety by reference). Thus, for example, for $E_b/N_0$=7.5 dB, $P_t$ is 96.4%.

In contrast, the probability that t+1 errors (9 errors in this case) are received is $$P_{t+1} \approx \frac{t+1}{n}\binom{n}{t+1}p_s^{t+1}(1-p_s)^{n-t-1}. \quad (3)$$

This probability is 1.4%. Similarly, the probability that t+2 errors (10 errors in this case) are received is $$P_{t+2} \approx \frac{t+2}{n}\binom{n}{t+2}p_s^{t+2}(1-p_s)^{n-t-2}. \quad (4)$$

This probability is 1.0%. Finally, the probability that t+3 errors (11 errors in this case) are received is $$P_{t+3} \approx \frac{t+3}{n}\binom{n}{t+3}p_s^{t+3}(1-p_s)^{n-t-3}. \quad (5)$$

This probability is 0.6%. These results imply that 98.8% of the received codewords will have 10 or fewer errors and that 99.4% of the received codewords will have 11 or fewer errors for $E_b/N_0$=7.5 dB. This means that only approximately one percent of the time is soft decision reliability information required at low probability of bit error operating points.

Herein for purposes of illustration and comparison results for double symbol transmission with 8-PSK and single symbol transmission with 16-PSK are detailed. Simulated numerical examples are provided to further illustrate performance of hybrid SD HD RS decoding method 114.

Figure 3:
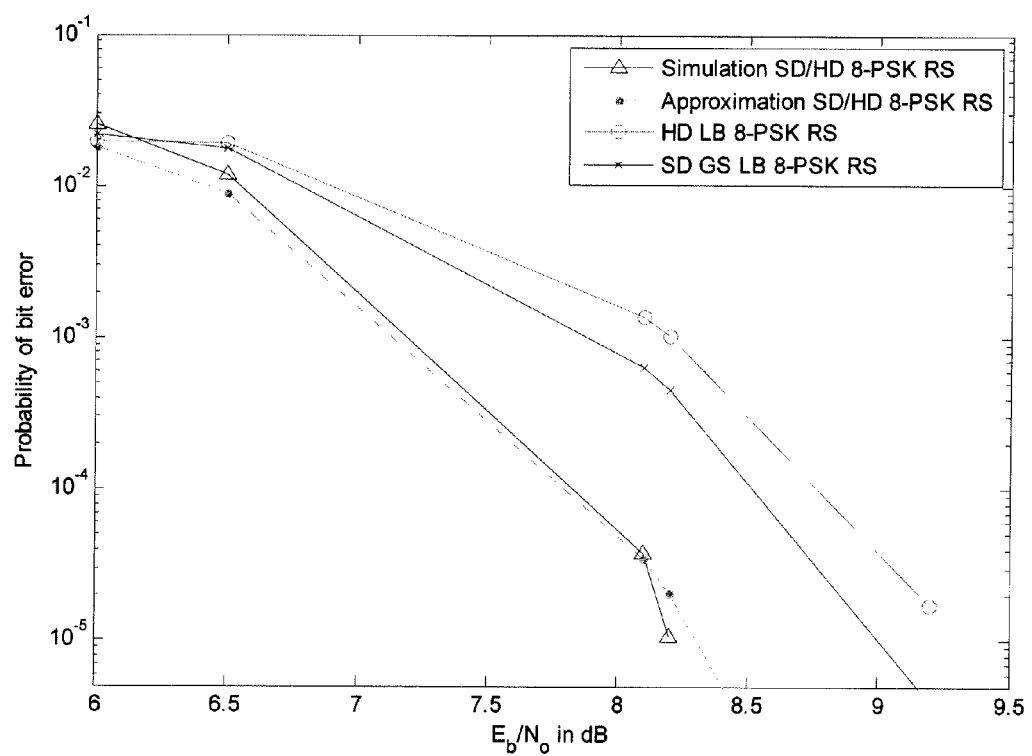
FIG. 3 is a graph illustrating an example of the simulated probability of bit error results of hybrid SD HD RS decoding method over an SD GS algorithm and traditional HD decoding for 8-PSK with a (63,47) RS code in accordance with one embodiment.

FIG. 3 is a graph 300 illustrating an example of the simulated probability of bit error results of hybrid SD HD RS decoding method 114 over an SD GS algorithm and traditional HD decoding for 8-PSK with a (63,47) RS code in accordance with one embodiment. Similar trends exist for (63,41) and (63,43) codes but the (63,47) code has excellent performance with minimal bandwidth expansion. As illustrated in FIG. 3, hybrid SD HD RS decoding method 114 performs 0.8 dB better than SD GS RS decoding and 1.1 dB better than traditional HD RS decoding at a probability of bit error at $10^{-5}$. This further illustrates hybrid SD HD RS decoding method 114 has an error correction capability of 12 symbols. This is a notable increase of four symbols over the HD error correction capability of eight symbols.

Notably, the SD reliability information is needed approximately one percent (1%) of the time to achieve a probability of bit error of $10^{-5}$, the maximum probability of bit error specified for many practical systems. The reduced improvement obtained with GS SD decoding is a consequence of the fact that the number of symbol errors that the GS SD algorithm can correct is $$t_{GS}=n-1\lfloor\sqrt{(k-1)n}\rfloor \quad (6)$$

For a (63,47) code with 8-PSK modulation, the above equation (6) yields an error correction capability of 9, an increase of only one over HD decoding. While better than the hard decision (HD) error correction capability, this is not as good as the 12 errors that hybrid SD HD RS decoding method 114 is able to correct.

The number of symbol errors per block that can be corrected using HD, GS SD, and hybrid SD HD RS decoding method 114 for several different RS code rates is illustrated in Table I.

TABLE I

Comparison of Error Correction Capabilities

| (n, k) | HD | Hybrid SD HD | GS SD |
|---|---|---|---|
| (63, 47) | 8 | 12 | 9 |
| (15, 11) | 2 | 2+ | 2 |
| (255, 223) | 16 | 23+ | 17 |

Using the probability of bit error for HD decoding developed in "Long Block Length Reed Solomon Coded M=ary Hyper Phase Shift Keying", *Proc. Asilomar Conf. on Signals, Systems, and Computers*, October 2008 by J. Caldwell and C. Robertson and "Reed Solomon Coded M-ary Hyper Phase Shift Keying", *Proc. Milcom Conf.*, November 2008 by J. Caldwell and C. Robertson, herein incorporated in their entirety by reference, with the hybrid SD HD error correction capabilities specified in Table I, a very accurate theoretical approximation is obtained that matches the simulation results in FIG. 3, FIG. 4, and FIG. 5.

Figure 4:
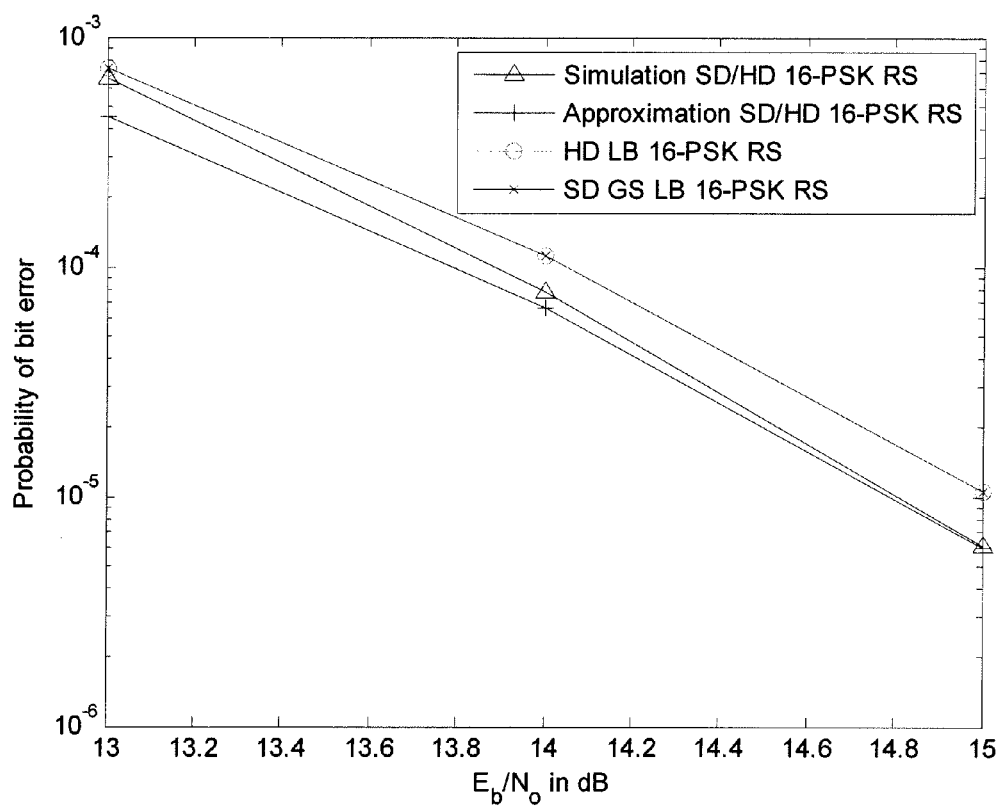
FIG. 4 is a graph illustrating an example of the simulated probability of bit error results of hybrid SD HD RS decoding method over an SD GS algorithm and traditional HD decoding for 16-PSK with a (15,11) RS code in accordance with one embodiment.

FIG. 4 is a graph 400 illustrating an example of the simulated probability of bit error results of hybrid SD HD RS decoding method 114 over an SD GS algorithm and traditional HD decoding for 16-PSK with a (15,11) RS code in accordance with one embodiment. For a (15,11) RS code with 16-PSK modulation, hybrid SD HD RS decoding method 114 can correct all two symbol error events and half of the three symbol error events, so its error correction capability is listed as 2+ in Table I. Longer block lengths at higher code rates used in high data rate systems are more illustrative of the trend with regard to the better performance that hybrid SD HD RS decoding method 114 offers. The (15,11) RS code is only included for the purposes of the example realization in Table II and is not used in practice due to its weak error correction properties.

The (255,223) RS code is used in industrial video high data rate downlinks to conserve spectrum while still getting good probability of bit error performance. For a (255,223) RS code with 16-QAM modulation, hybrid SD HD RS decoding method 114 can correct all 23 symbol error events and half of the 24 symbol error events so its error correction capability is listed as 23+ in Table I.

TABLE I

Comparison of Error Correction Capabilities

| (n, k) | HD | Hybrid SD HD | GS SD |
|---|---|---|---|
| (63, 47) | 8 | 12 | 9 |
| (15, 11) | 2 | 2+ | 2 |
| (255, 223) | 16 | 23+ | 17 |

For 16-PSK, a numerical example is also provided to illustrate the power of hybrid SD HD decoding in addition to simulation results. In Table II, the example is illustrated for $E_b/N_0=12$ dB.

TABLE II

Example realization for (15, 11) Code

| Symbol Location | Hard Decision Estimate | Second Most Likely Estimate | Symbol Actually Sent |
|---|---|---|---|
| 1 | 3-86% | 2-14% | 2 |
| 8 | 3-84% | 4-16% | 4 |
| 10 | 4-56% | 3-44% | 3 |

In this example, the received message can be successfully decoded in one iteration by the hybrid SD HD decoder. The actual message sent in terms of symbol number was (2 1 2 1 3 3 1 4 1 3 3 15 11 1 7) while the received message in terms of symbol number was (3 1 2 1 3 3 1 3 1 4 3 15 11 1 7). In this case, the most likely symbol errors are all actual errors. In this example, hybrid SD HD RS decoding method 114 is successful even when most likely errors are not actually errors but the algorithm might be forced to go through all its possible iterations. The number of possible iterations is $2^c$ where c is the number of most likely errors. In this example, there would be eight possible iterations even though only one was needed. In the next section, results are provided for 16-QAM and 256-QAM.

Figure 5:
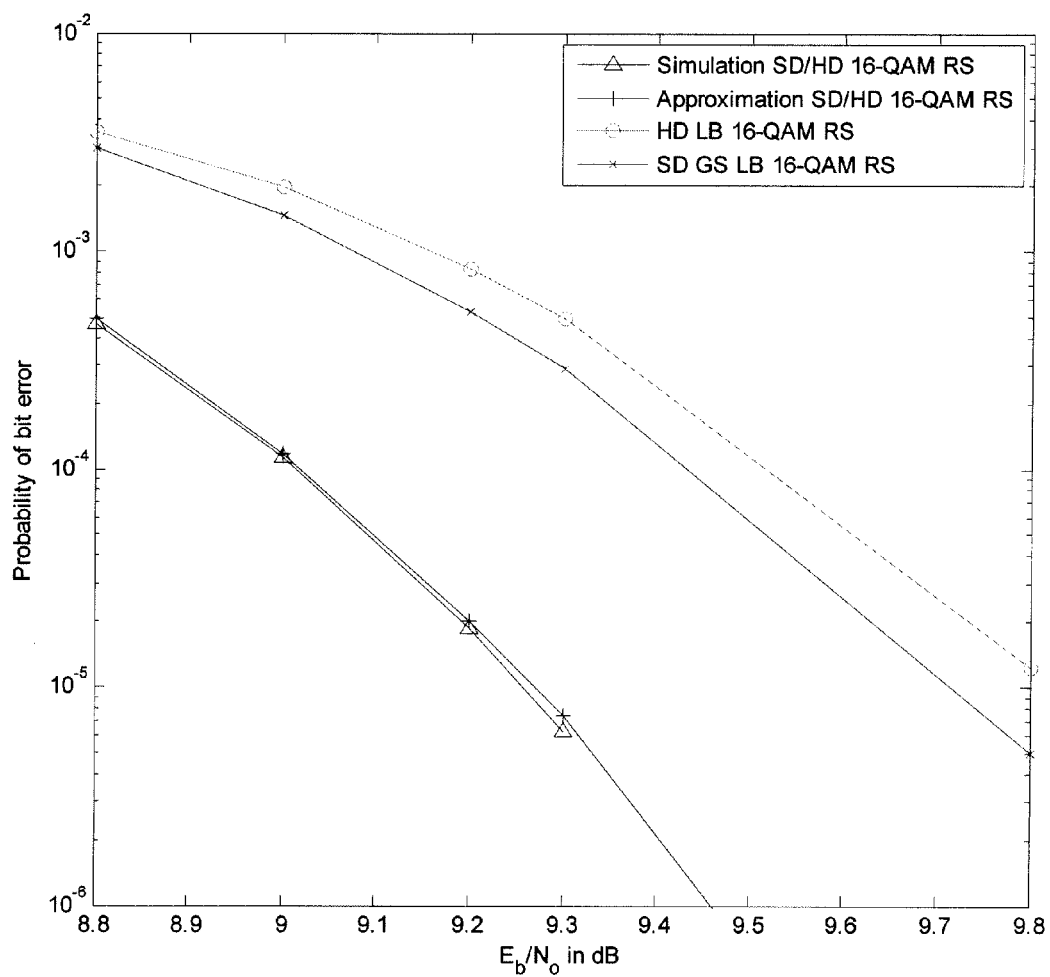
FIG. 5 is a graph illustrating an example of the simulated probability of bit error results of hybrid SD HD RS decoding method over an SD GS algorithm and traditional HD decoding for double symbol transmission with 16-QAM with a (255,223) RS code in accordance with one embodiment.

FIG. 5 is a graph 500 illustrating an example of the simulated probability of bit error results of hybrid SD HD RS decoding method 114 over an SD GS algorithm and traditional HD decoding for double symbol transmission with 16-QAM with a (255,223) RS code in accordance with one embodiment. The DVB-H standard currently uses a (255, 223) RS code with 16-QAM modulation as part of its downlink. This high data rate link conserves spectrum while still providing good probability of bit error performance. By using hybrid SD HD RS decoding instead of standard HD RS decoding, in one embodiment, performance is improved by 0.5 dB at the standard operating point (probability of bit error at $10^{-5}$). The GS SD RS decoding algorithm does improve results as compared to traditional HD RS decoding but does not compare favorably with hybrid SD HD RS decoding method 114 results as shown in FIG. 5.

Thus, as earlier detailed, embodiments in accordance with the invention provide a hybrid SD HD RS decoding method in which traditional hard decision (HD) RS decoding is used, and when a HD RS decoding failure occurs, SD reliability information is used to estimate which received code symbols have a low probability of being correctly received. This information is used to generate new code symbol estimates which are subsequently used to revise the HD RS decoding algorithm. The revised HD RS decoding method is then used to decode the input code symbols.

Because the majority of decoding failures are caused when the total number of code symbol errors exceeds the error correction capability t of the RS code by only a few symbols, only a few code symbols must be corrected in this fashion in order to successfully decode the received block. Because block errors occur infrequently, the great majority of the time only the less complex HD RS decoding algorithm, i.e., the HD RS method, is utilized. This reduction in computational complexity is significant as compared to the GS SD algorithm.

Accordingly, this disclosure provides exemplary embodiments of the present invention. The scope of the present invention is not limited by these exemplary embodiments. Numerous variations, whether explicitly provided for by the specification or implied by the specification or not, may be implemented by one of skill in the art in view of this disclosure.

What is claimed is:

1. A method comprising:
   (a) inputting received code symbols into a hard decision (HD) Reed Solomon (RS) decoding method;
   (b) decoding the received code symbols with the HD RS decoding method;
   (c) determining whether a decoding failure occurs;
   (d) wherein when a decoding failure does not occur, outputting decoded data;
   (e) wherein when a decoding failure occurs, computing soft decision (SD) reliability information for each code symbol to determine most likely code symbol errors, wherein computing SD reliability information for each code symbol further comprises:
   computing a single matrix for all possible code symbols at each code symbol location where each matrix element is given by $$P_r(T = t_\alpha \mid R = r_\beta) = \frac{f(r_\beta \mid t_\alpha)}{\sum_{t \in T} f(r_\beta \mid t)}$$

where T is an M-ary signal that represents a transmitted symbol, R is a random variable that models the received code signal, $f(r_\beta|t_\alpha)$, is a conditional probability density function, $\alpha$ varies from 1 to M, M being a number of symbols in a constellation, and $\beta$ varies from 1 to n, n being a block length of a code;

(f) selecting the most likely code symbol errors for each code symbol from the single matrix;

(g) inputting the most likely code symbol errors for each code symbol into the HD RS decoding method to generate a revised HD RS decoding method;

(h) decoding the received code symbols with the revised HD RS decoding method;

(i) determining whether a decoding failure occurs;

(j) wherein when a decoding failure does not occur, outputting the decoded data;

(k) wherein when a decoding failure occurs, selecting next most likely code symbol errors for each code symbol;

(l) inputting the next most likely code symbol errors for each code symbol into the HD RS decoding method to generate a revised HD RS decoding method; and (m) returning to operation (h).

2. The method of claim 1 further comprising:
wherein when a decoding failure occurs, determining whether a decoding failure threshold is met;
wherein when the decoding failure threshold is met, generating a decoding failure and exiting the method; and
wherein when the decoding failure threshold is not met, continuing processing.

3. A communications system comprising:
a transmitter for transmitting code signals over a channel; and
a decoder for receiving the code signals, the decoder for implementing a hybrid soft decision (SD) hard decision (HD) Reed Solomon (RS) decoding method, wherein the hybrid SD HD RS decoding method comprises:

(a) inputting received code symbols into a hard decision (HD) Reed Solomon (RS) decoding method;

(b) decoding the received code symbols with the HD RS decoding method;

(c) determining whether a decoding failure occurs;

(d) wherein when a decoding failure does not occur, outputting decoded data;

(e) wherein when a decoding failure occurs, computing soft decision (SD) reliability information for each code symbol to determine most likely code symbol errors, wherein computing SD reliability information for each code symbol further comprises:

computing a single matrix for all possible code symbols at each code symbol location where each matrix element is given by $$P_r(T = t_\alpha \mid R = r_\beta) = \frac{f(r_\beta \mid t_\alpha)}{\sum_{t \in T} f(r_\beta \mid t)}$$

where T is an M-ary signal that represents a transmitted symbol, R is a random variable that models the received code signal, $f(r_\beta|t_\alpha)$, is a conditional probability density function, $\alpha$ varies from 1 to M, M being a number of symbols in a constellation, and $\beta$ varies from 1 to n, n being a block length of a code (f) selecting the most likely code symbol errors for each code symbol from the single matrix;

(g) inputting the most likely code symbol errors for each code symbol into the HD RS decoding method to generate a revised HD RS decoding method;

(h) decoding the received code symbols with the revised HD RS decoding method;

(i) determining whether a decoding failure occurs;

(j) wherein when a decoding failure does not occur, outputting the decoded data;

(k) wherein when a decoding failure occurs, selecting next most likely code symbol errors for each code symbol;

(l) inputting the next most likely code symbol errors for each code symbol into the HD RS decoding method to generate a revised HD RS decoding method; and (m) returning to operation (h).

4. The communications system of claim 3, the hybrid SD HD RS decoding method further comprising:
wherein when a decoding failure occurs, determining whether a decoding failure threshold is met;
wherein when the decoding failure threshold is met, generating a decoding failure and exiting the method; and
wherein when the decoding failure threshold is not met, continuing processing.

* * * * *